United States Patent
Kondo et al.

(10) Patent No.: US 6,951,771 B2
(45) Date of Patent: Oct. 4, 2005

(54) METHOD OF FORMING LAMINATE AND METHOD OF MANUFACTURING PHOTOVOLTAIC DEVICE

(75) Inventors: Takaharu Kondo, Kyoto (JP); Hideo Tamura, Nara (JP); Atsushi Yasuno, Nara (JP); Noboru Toyama, Osaka (JP); Yuichi Sonoda, Nara (JP); Masumitsu Iwata, Kyoto (JP); Akiya Nakayama, Nara (JP); Yusuke Miyamoto, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 10/616,937

(22) Filed: Jul. 11, 2003

(65) Prior Publication Data
US 2004/0067321 A1 Apr. 8, 2004

(30) Foreign Application Priority Data
Jul. 18, 2002 (JP) ........................................ 2002-209720

(51) Int. Cl.$^7$ .................. H01L 21/00; H01L 31/00; H01L 31/18; H01L 27/14; B05D 5/12
(52) U.S. Cl. .................. 438/69; 438/85; 427/74; 427/75; 427/419.1; 136/256; 136/258
(58) Field of Search .................. 438/48, 57, 69, 438/85; 427/74, 75, 419.1; 257/428, 431, 436, 459; 136/256, 258

(56) References Cited

U.S. PATENT DOCUMENTS

| | | | | |
|---|---|---|---|---|
| 5,476,798 A | * | 12/1995 | Guha | 438/96 |
| 5,958,358 A | * | 9/1999 | Tenne et al. | 423/561.1 |
| 6,153,823 A | * | 11/2000 | Shiozaki et al. | 136/249 |
| 6,271,055 B1 | * | 8/2001 | Yajima et al. | 438/97 |
| 6,388,301 B1 | * | 5/2002 | Tawada et al. | 257/436 |
| 6,794,275 B2 | * | 9/2004 | Kondo et al. | 438/485 |
| 2001/0013362 A1 | * | 8/2001 | Kondo | 136/265 |
| 2001/0025601 A1 | * | 10/2001 | Yajima et al. | 118/200 |
| 2002/0157703 A1 | * | 10/2002 | Nakayama et al. | 136/256 |
| 2003/0011047 A1 | * | 1/2003 | Cunningham et al. | 257/614 |
| 2003/0075717 A1 | | 4/2003 | Kondo et al. | 257/64 |
| 2003/0104664 A1 | | 6/2003 | Kondo et al. | 438/200 |
| 2003/0227082 A1 | * | 12/2003 | Kondo et al. | 257/728 |
| 2004/0187914 A1 | * | 9/2004 | Matsuda et al. | 136/255 |

FOREIGN PATENT DOCUMENTS

| | | |
|---|---|---|
| JP | 6-204515 | 7/1994 |
| JP | 8-217443 | 8/1996 |

OTHER PUBLICATIONS

"A Particle Agglutination Assay For Rapid Identification Of Heparin Binding To Coagulase–negative Staphylococci," C. Pascu, et al., J. Med. Microbiol., vol. 45, pp. 263–269 (1996).

* cited by examiner

Primary Examiner—M. Wilczewski
(74) Attorney, Agent, or Firm—Fitzpatrick, Cella, Harper & Scinto

(57) ABSTRACT

A method of forming a laminate and a method of manufacturing a photovoltaic device using the laminate are provided. The laminate forming method includes a first step of forming an intermediate layer on a base member, and a second step of forming a metal layer on the intermediate layer, the adhesion of the metal layer to the base member being lower than that of the intermediate layer, the reflectance of the metal layer being higher than that of the intermediate layer. The rate of formation of the metal layer is increased at an intermediate stage in the second step. The laminate thereby formed has improved characteristics and is capable of maintaining improved reflection characteristics and adhesion even under high-temperature and high-humidity conditions or during long-term use.

5 Claims, 7 Drawing Sheets

METHOD OF FORMING LAMINATE AND METHOD OF MANUFACTURING PHOTOVOLTAIC DEVICE

BACKGROUND OF THE INVENTION

1. Field of the Invention

The present invention relates to a method of forming a laminate by laminating an intermediate layer and a metal layer, a method of forming a laminate by laminating a metal layer and a metal oxide layer and a method of manufacturing a photovoltaic device.

2. Related Background Art

As a photovoltaic device having an amorphous semiconductor layer formed of silicon, silicon-germanium or silicon carbide, or a semiconductor layer containing crystal phases including those formed of a microcrystal and a polycrystal of such a material, a device having a reflecting layer formed on the back surface of the semiconductor layer to improve the collection efficiency at long wavelengths has been used. It is desirable that such a reflecting layer exhibit an effective reflection characteristic closer to a band end of the semiconductor material, i.e., in the range of 800 to 1200 nm. Examples of materials sufficiently satisfying this condition are metals such as gold, silver, copper and aluminum, and alloys of these metals.

An arrangement using an optically transparent layer having irregularities to achieve optical confinement has also been used. In general, attempts have been made to enable effective use of reflected light for improvement in short-circuit current density Jsc by forming a laminate in which a metal oxide layer having irregularities is provided between the reflecting layer and the semiconductor layer. Degradation in characteristics due to a shunt path is prevented by providing such a metal oxide layer. Attempts have also been made to increase the optical path length for incident light in the semiconductor layer by providing a metal oxide layer having irregularities on the light incidence side of a semiconductor device for the purpose of enabling effective use of reflected light for improvement in short-circuit current density Jsc.

For example, the achievement of an increase in short-circuit current by an optical confinement effect based on a combination of a reflecting layer formed of silver atoms and having irregularities and a zinc oxide layer is described in P-IA-15 a-SiC/a-Si/a-SiGe Multi-Bandgap Stacked Solar Cells With Bandgap Profiling Sannomiya et al., Technical Digest of the International PVSEC-5, Kyoto, Japan, p387, 1990, and other documents. Japanese Patent Application Laid-Open No. 8-217443 discloses a method of uniformly forming a zinc oxide thin film having an improved transmittance by performing electrolysis in an aqueous solution containing zinc ions and nitric acid ions.

In Japanese Patent Application Laid-Open No. 6-204515 is described the construction of stainless substrate/Ti/Ag/ZnO/Si and is disclosed use of a Ti layer for improving the adhesion to the substrate.

Further improvements in the characteristics of the reflecting layer and the metal oxide layer are being pursued to improve the characteristics of photovoltaic devices. Also there is a problem that a photovoltaic device becomes deteriorated in photoelectric conversion characteristics and durability, for example, due to a reduction in reflectance of a metal layer, a reduction in transmittance of a transparent electroconductive layer or a reduction in adhesion between adjacent layers in a case where the photovoltaic device is used under high-temperature and high-humidity conditions or used through a long period of time, in a case where a plurality of the photovoltaic devices are used in a state of being connected in series, and where the photovoltaic devices are maintained in a state of partially irradiated with light for a long time, or in a case where a voltage with a polarity opposite to that of the voltage generated by normal photoelectric conversion is applied to part of a plurality of photovoltaic devices not irradiated with light.

SUMMARY OF THE INVENTION

In view of the above-described problems, an object of the present invention is to provide a method of forming a laminate having improved characteristics and capable of maintaining improved reflection characteristics and adhesion even under high-temperature and high-humidity conditions or during long-term use, the laminate formed by the method, and a photovoltaic device including the laminate.

The present invention provides a laminate forming method including a first step of forming an intermediate layer on a base member, and a second step of forming a metal layer on the intermediate layer, the adhesion of the metal layer to the base member being lower than that of the intermediate layer, the reflectance of the metal layer being higher than that of the intermediate layer, wherein the rate of formation of the metal layer is increased at an intermediate stage in the second step.

The present invention provides a laminate forming method including a first step of forming a metal layer on a base member to be processed, and a second step of forming a metal oxide layer on the metal layer, wherein the rate of formation of the metal layer is reduced at an intermediate stage in the first step, and the rate of formation of the metal oxide layer is increased at an intermediate stage in the second step.

The present invention also provides a method of manufacturing a photovoltaic device, including a first step of forming an intermediate layer on a base member, a second step of forming a metal layer on the intermediate layer, the adhesion of the metal layer to the base member being lower than that of the intermediate layer, the reflectance of the metal layer being higher than that of the intermediate layer, and a third step of forming a semiconductor layer directly on the metal layer or with a metal oxide layer interposed between the semiconductor layer and the metal layer, wherein the rate of formation of the metal layer is increased at an intermediate stage in the second step.

The present invention further provides a method of manufacturing a photovoltaic device, including a first step of forming a metal layer on a base member to be processed, a second step of forming a metal oxide layer on the metal layer, and a third step of forming a semiconductor layer on the metal oxide layer, wherein the rate of formation of the metal layer is reduced at an intermediate stage in the first step, and the rate of formation of the metal oxide layer is increased at an intermediate stage in the second step.

It is preferable to set the thickness of the intermediate layer within the range of 30 to 100 nm. It is preferable to set the rate of formation of the metal layer within the range of 0.5 to 4.0 nm/s before increasing the rate of formation of the metal layer. It is preferable to increase the rate of formation of the metal layer when the metal layer is formed on the intermediate layer to a thickness within the range of 1 nm to 100 nm. It is preferable to set the rate of formation of the metal layer within the range of 0.5 to 4.0 nm/s by reducing the rate of formation of the metal layer. It is preferable to form the metal layer to a thickness within the range of 1 to 100 nm and form the metal oxide layer on the metal layer after reducing the rate of formation of the metal layer. It is preferable to set the rate of formation of the metal oxide layer within the range of 0.05 to 3.0 nm/s before increasing the rate of formation of the metal oxide layer. It is preferable to increase the rate of formation of the metal oxide layer when the metal oxide layer is formed on the metal layer to a thickness within the range of 5 nm to 50 nm. It is preferable to contain oxygen in the forming atmosphere at least immediately before the completion of formation of the metal layer and immediately after the start of formation of the metal oxide layer. It is preferable to contain oxygen in the forming atmosphere after reducing the rate of formation of the metal layer and before increasing the rate of formation of the metal oxide layer.

A combination of the above-described laminate forming methods may be selected as desired to be used. Also, a combination of the above-described photovoltaic device manufacturing methods may be selected as desired to be used.

DETAILED DESCRIPTION OF THE PREFERRED EMBODIMENTS

Figure 1:
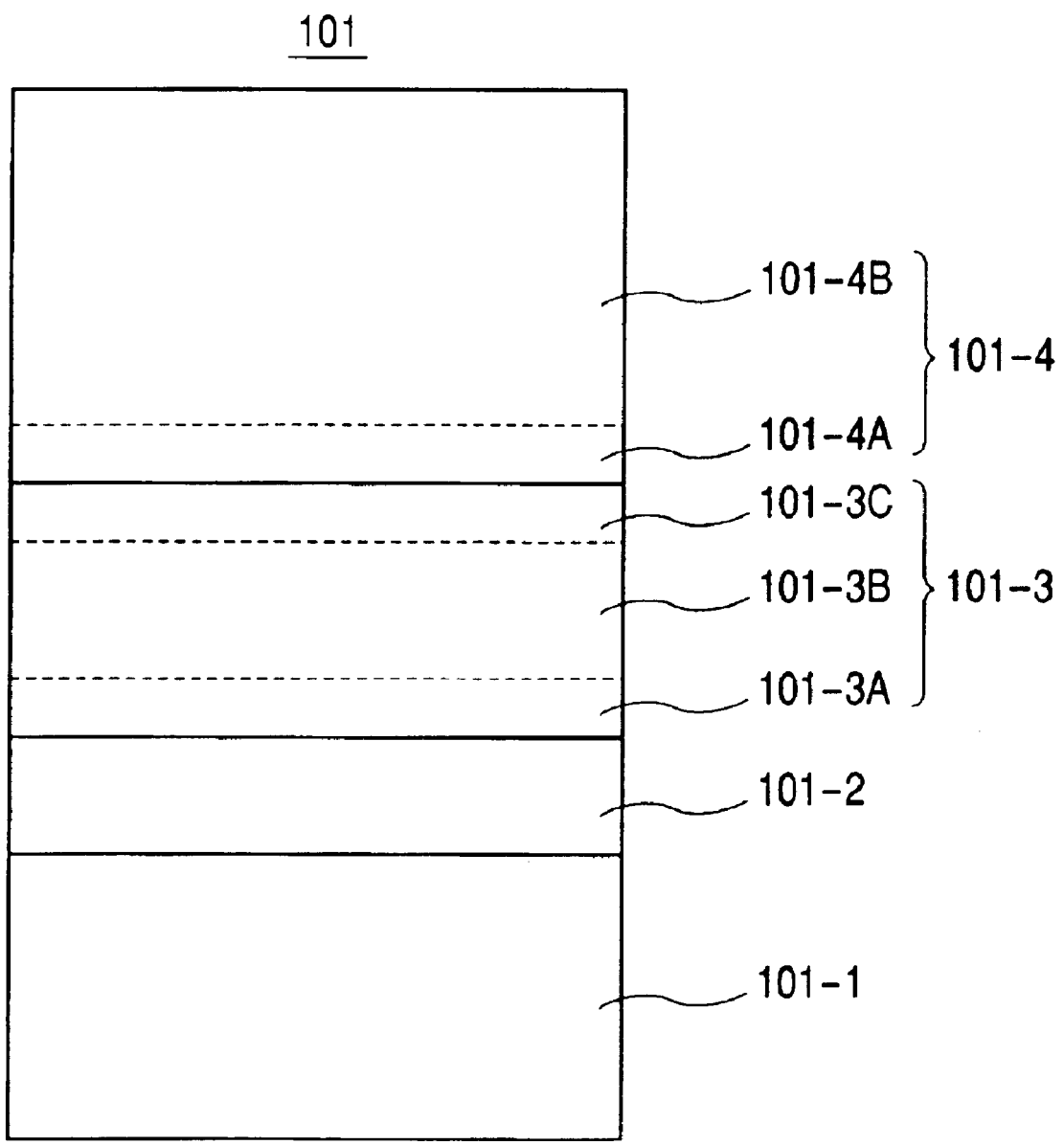
FIG. 1 is a schematic cross-sectional view of an example of a laminate manufactured in accordance with the present invention.

The inventors of the present invention eagerly made studies to solve the above-described problems and found that a laminate formed by a laminate forming method including a first step of forming an intermediate layer on a base member, and a second step of forming a metal layer on the intermediate layer, the adhesion of the metal layer to the base member being lower than that of the intermediate layer, the reflectance of the metal layer being higher than that of the intermediate layer, wherein the rate of formation of the metal layer is increased at an intermediate stage in the second step, or by a laminate forming method including a first step of forming a metal layer on a base member to be processed, and a second step of forming a metal oxide layer on the metal layer, wherein the rate of formation of the metal layer is reduced at an intermediate stage in the first step, and the rate of formation of the metal oxide layer is increased at an intermediate stage in the second step, and a photovoltaic device using the above-described laminate as a substrate have improved characteristics and are capable of maintaining improved reflection characteristics and adhesion even under high-temperature and high-humidity conditions or using long-term use.

The above-described constitution has effects described below.

The intermediate layer is formed to improve the adhesion between the layers is improved in comparison with that in an arrangement in which a metal layer is formed directly on a base member, thereby ensuring that degradation in the functions of the laminate is limited even during use for a long time or under high-temperature and high-humidity conditions. In a case where the above-described laminate is used as a substrate of a photovoltaic device, a plurality of the photovoltaic devices may be connected in series and used in a state of being partially irradiated with light for a long time. In such a case, a voltage with a polarity opposite to that of the voltage generated by normal photoelectric conversion is applied to part of the photovoltaic devices not irradiated with light. Even under such a condition, degradation in characteristics can be limited.

Another effect of the provision of the intermediate layer is an influence on the surface configuration of the metal layer and the metal oxide layer. Details of the cause of this effect have not been made clear. However, it is thought that the effect relates to changes in the frequency of occurrence and the density of occurrence of growth nuclei in the metal layer and the rate of growth of the metal layer in an arbitrary direction from each nucleus due to wettability between the layers and variation in interfacial free energy. In a case where the laminate having the metal layer is used as a substrate of a photovoltaic device, the laminate has a role of a reflecting layer reflecting light reaching the laminate to enable the light to be reused in the semiconductor layer. Increasing the optical path length for reflected light in the semiconductor layer by having irregularities on the surface of the metal layer or the metal oxide layer so that the amount of reusable light is increased is effective in optimizing the above-described role of the laminate. If the thickness of the intermediate layer is insufficient, the effect obtained by insertion of the intermediate layer is not advantageously high. If the intermediate layer is excessively thick, the uniformity of irregularities in the surfaces of the metal layer and the metal oxide layer is reduced and it is difficult to grow optically effective irregularities. The cause of this phenomenon has not been made clear. This phenomenon is considered due to occurrence of a nonuniform region such as a transition region in the intermediate layer surface. It is thought that irregularity configurations in the surfaces of the metal layer and the metal oxide layer can be made uniform and in a desirable condition by selecting the thickness of the intermediate layer while considering the above-described points, and that it is important to maintain the temperature of the formation surface above a certain point at the time of formation of the intermediate layer and to thereby promote the surface reaction in providing a basis for improving the adhesion and growing irregularities in the surfaces of the metal layer and the metal oxide layer.

The inventors of the present invention eagerly studied by considering the above-described points and found that it is preferable to set the thickness of the intermediate layer within the range of 30 nm to 100 nm, and it is also preferable to set the temperature of the formation surface of the intermediate layer to 300° C. or higher.

The adhesion between the metal layer and the intermediate layer can be improved by increasing the rate of formation of the metal layer in an intermediate stage of formation of the metal layer on the intermediate layer. Further, the conditions of the surfaces of the metal layer and the metal, oxide layer can be improved thereby. Preferably, the rate of formation of the metal layer is increased when the metal layer is formed to a thickness within the range of 1 to 100 nm on the intermediate layer.

To achieve the effect of improving the adhesion between the metal layer and the intermediate layer, it is preferable to increase the formation rate when the metal layer is formed to a thickness of 1 nm or more on the intermediate layer. From the viewpoint of achieving the effect of growing an irregularity configuration in the metal layer surface and from the viewpoint of productivity, it is preferable to limit the range of the thickness of the metal layer formed before increasing the formation rate to 100 nm or less.

It is preferable to form the metal layer at a rate of 4.0 nm/s or lower before the formation rate is increased. If importance is attached to the productivity, it is preferable to form the metal layer at a rate of 0.5 nm/s or higher before the formation rate is increased, and the temperature of the formation surface of the metal layer is preferably 300° C. or higher.

The method of reducing the formation rate at an intermediate stage in the step of forming the metal layer on the intermediate layer and forming the metal oxide layer on the metal layer is preferable because the adhesion between the metal layer and the metal oxide layer is improved. It is thought that in a case where oxygen is contained in the atmosphere for forming the metal layer after the formation rate has been reduced, in particular, at least part of the metal layer is oxidized and stabilization of the interfacial structure and, hence, an improvement in adhesion at the interface can be achieved by the effect of this oxidation and the effect of prevention of diffusion of metal atoms through the metal oxide layer. More preferably, the metal layer is formed to a thickness within the range of 1 to 100 nm after reducing the rate of formation of the metal layer, and the metal oxide layer is then formed on the metal layer. To achieve the above-described improvement effect, it is preferable to set the rate of formation of the metal layer to 4.0 nm/s or lower after reducing the formation rate. From the viewpoint of productivity, setting the formation rate to 0.5 nm/s or higher is preferred and setting the temperature of the formation surface of the metal layer 300° C. or higher is also preferred.

To achieve the effect of improving the adhesion between the metal layer and the metal oxide layer, it is preferable to set the thickness of the metal layer formed after reducing the formation rate to 1 nm or larger. From the viewpoint of achieving the effect of growing an irregularity configuration in the metal layer surface and from the viewpoint of productivity, it is preferable to limit the range of the thickness of the metal layer after reducing the formation rate to 100 nm.

Increasing the rate of formation of the metal oxide layer at an intermediate stage in the step of forming the metal oxide layer on the metal layer is preferable because the adhesion between the metal layer and the metal oxide layer is improved. Containing oxygen in the atmosphere for forming the metal oxide layer before increasing the formation rate is particularly preferable. If the material of the metal oxide layer is, for example, zinc oxide, the zinc oxide layer is transparent in the visible region since its band gap is about 3.3 eV. If the zinc oxide layer is formed so as to have a zinc-excessive-type composition due to intrusion of zinc atoms into the lattice, oxygen atom vacancies in the lattice, etc., an excess amount of zinc forms a donor level such that the zinc oxide layer functions as a transparent electroconductive layer having suitable electrical conductivity. It is thought that an increase in the rate of formation of the metal oxide layer at an intermediate stage of formation of the metal oxide layer on the metal surface contributes to an improvement in adhesion between the metal layer and the metal oxide layer in comparison with a case in which the metal oxide layer is formed at a constant rate on the metal layer. This thought to be because the formation of an inconsistency region in the interface due to the difference between the metal layer having a close-packed structure or a like structure and the metal oxide layer not having a close-packed structure is limited. In particular, this is thought to be because if oxygen is contained in the atmosphere for forming the metal oxide layer before increasing the formation rate, the ratio of the amount of oxygen and the amount of zinc in zinc oxide becomes closer to the stoichiometric ratio and the excess amount of zinc in zinc oxide, particularly the amount of zinc ions existing in the lattice is reduced to reduce lattice stress in zinc oxide in the junction region between the metal layer and the metal oxide layer. From the viewpoint of achieving the above-described effect and avoiding degradation in the functions of the transparent electroconductive layer, it is preferable to set within the range of 5 to 50 nm the thickness of the metal oxide layer formed before increasing the formation rate.

To achieve the effect of limiting the formation of the inconsistency region between the metal layer and the metal oxide layer, it is preferable to set to 5 nm or larger the thickness of the metal oxide layer formed before increasing the formation rate. From the viewpoint of productivity, limiting the thickness of the metal oxide layer formed before increasing the formation rate is preferred. If the metal oxide layer is formed under an oxygen containing condition before the formation rate is increased, and if the thickness of the metal oxide layer formed before increasing the formation rate is excessively large, the resistivity of the metal oxide layer is considerably high since the oxygen content is increased to increase the resistivity of the metal oxide layer. From consideration of the above, it is preferable to set the thickness of the metal oxide layer formed before increasing the formation rate within the range not exceeding 50 nm.

To achieve the above-described improvement effect, it is preferable to set rate of formation of the metal oxide layer before increasing the formation rate to 3.0 nm/s or lower. From consideration of productivity, setting the formation rate to 0.05 nm/s or higher is preferred and setting the temperature of the formation surface of the metal oxide layer to 200° C. or higher is also preferred. In particular, if the metal oxide layer is formed by setting the temperature of its formation surface below the temperature of the formation surface of the metal layer, internal stress after the formation of the laminate is reduced. Therefore this setting is preferable.

Components of a photovoltaic device using the laminate of the present invention as a substrate will be described below.

Figure 2:
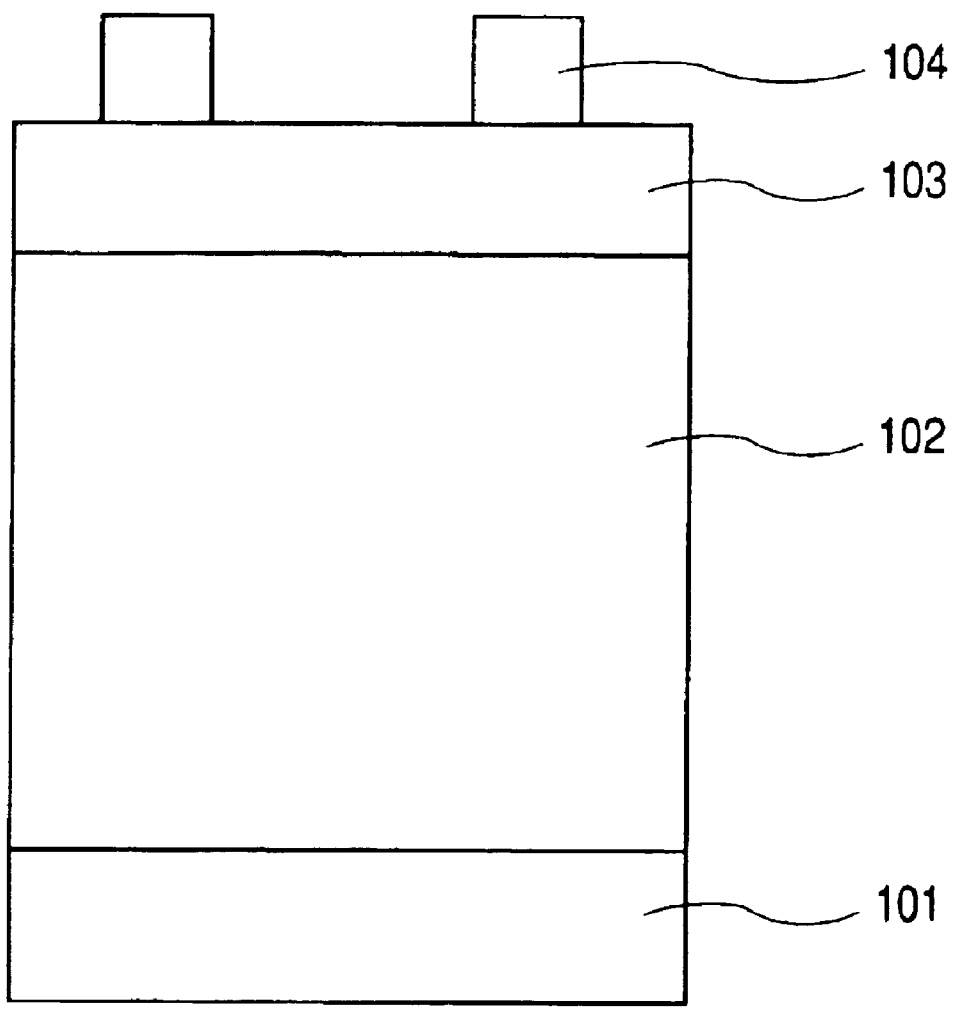
FIG. 2 is a schematic cross-sectional view of an example of a photovoltaic device manufactured in accordance with the present invention.

FIGS. 1 and 2 are schematic cross-sectional views of a substrate and an example of a photovoltaic device in accordance with the present invention. In FIGS. 1 and 2, a substrate is indicated by 101, a semiconductor layer by 102, a transparent electroconductive layer by 103, and a current collecting electrode by 104. The substrate 101 is constituted by a base member 101-1, an intermediate layer 101-2, a metal layer 101-3 and a metal oxide layer 101-4.

(Base Member)

As the base member 101-1, a plate or a sheet made of a metal, a resin, a glass, a ceramic or a semiconductor is favorably used. The base member 101-1 may have fine irregularities in its surface. If the base member 101-1 may be formed from a member of an elongated shape which can be formed by continuous film forming using a roll-to-roll method. A material having flexibility, e.g., stainless steel or a polyimide is particularly preferred as a material for the base member 101-1.

(Intermediate Layer)

As a material for the intermediate layer 101-2 which is a constituent of the present invention, a material is selected which has a degree of adhesion to the base member higher than the degree of adhesion between the base member and the metal layer, and also has suitable adhesion to the metal layer. The intermediate layer is capable of influencing the surface configuration of the metal layer formed on the intermediate layer. The material and thickness of the intermediate layer are selected so as to satisfy the above-described conditions, thereby enabling suitable irregularities to be uniformly formed in the surfaces of the metal layer and the metal oxide layer while maintaining the desired reflectivity. The material of the intermediate layer is selected from transition metals or oxides of metals satisfying the above-described conditions. Nickel, chromium, titanium, ZnO, $SnO_2$, $In_2O_3$, ITO ($In_2O_3+SnO_2$) or the like is favorably used as a material for the intermediate layer. Evaporation, sputtering or electrodeposition is favorably used as a method of forming the intermediate layer. In examples of the present invention described below, a base member having such an intermediate layer corresponds to the base member to be processed. However, the base member to be processed is not limited to this.

(Metal Layer)

The metal layer 101-3 has a role of an electrode and a role of a reflecting layer for reflecting light not absorbed by the semiconductor layer 102 to enable reuse of this light in the semiconductor layer 102. As a material for the metal layer 101-3, Al, Cu, Ag, Au, CuMg, AlSi or the like is favorably used. Evaporation, sputtering or electrodeposition is favorably used as a method of forming the metal layer 101-3. Preferably, the metal layer 101-3 has irregularities in its surface. The optical path length for reflected light in the semiconductor layer 102 is thereby increased to increase short-circuit current. In forming the metal layer, it is preferable to use a method of reducing the rate of formation of the metal layer in a region where the metal layer contacts the intermediate layer and/or in a region where the metal layer contacts the metal oxide layer. Also, it is preferable to contain oxygen in a forming atmosphere for forming in the region where the metal layer contact the metal oxide layer.

(Metal Oxide Layer)

The metal oxide layer 101-4 has a role of increasing diffused reflection of incident light and reflected light to increase the optical path length in the semiconductor layer 102. The metal oxide layer 101-4 also has a role of preventing shunt in the photovoltaic device caused by diffusion or migration of elements in the intermediate layer 101-2 and the metal layer 101-3 into the semiconductor layer 102. Further, the metal oxide layer 101-4 has a suitable resistance to have a role of preventing short-circuit due to a defect such as pin holes in the semiconductor layer. Preferably, the metal oxide layer 101-4 has irregularities in its surface, as does the metal layer 101-3. Preferably, the metal oxide layer 101-4 is a layer of an electroconductive oxide such as ZnO or ITO, and is formed by evaporation, sputtering, CVD, electrodeposition or the like. Some of these forming methods may be used in combination if necessary. A material for changing the electric conductivity may be added to the above-described electroconductive oxide. In forming the metal oxide layer, it is preferable to use a method of reducing the rate of formation of the metal oxide layer in a region where the metal oxide layer contacts the metal layer. Also, it is preferable to contain oxygen in a forming atmosphere for forming in the region where the metal oxide layer contacts the metal layer.

The formation of each of the metal layer and the metal oxide layer by sputtering is largely influenced by the kind of forming method, the kind and flow rate of a gas, the internal pressure, the applied electric power, the forming rate, the temperature of the formation surface, etc. In the case of forming zinc oxide film by DC magnetron sputtering using a zinc oxide target, kinds of gas used are, for example, some of Ar, Ne, Kr, Xe, Hg, and $O_2$, and it is desirable that the flow rate, which depends on the size of the apparatus and the exhaust rate, be 1 to 100 $cm^3$/min (normal) if the capacity of the film forming space is 20 liters. It is also desirable that the internal pressure at the time of film forming be 10 mPa to 10 Pa.

Preferably, as a condition under which the metal oxide layer formed of zinc oxide is formed by electrodeposition, an aqueous solution containing nitric acid ions and zinc ions is used in a corrosion-resistant container. It is desirable that the concentration of nitric acid ions and zinc ions be within the range of 0.001 to 1.0 mol/l. It is more desirable that the concentration be within the range of 0.01 to 0.5 mol/l. It is further desirable that the concentration be within the range of 0.1 to 0.25 mol/l. Sources for supplying nitric acid ions and zinc ions are not limited to particular kinds. Zinc nitrate may be used as a source for supplying both these kinds of ions, and a mixture of a water-soluble nitrate such as ammonium nitrate, which is a nitric acid ion supply source, and a zinc salt such as zinc sulfate, which is a zinc ion supply source, may be used. Further, it is preferable to add a carbohydrate to an aqueous solution of each of these supply source materials for the purpose of limiting abnormal growth and improving adhesion. Any carbohydrate may be added for this purpose. However, a monosaccharide such as glucose (grape sugar) or fructose (fruit sugar), a disaccharide such as maltose (malt sugar) or saccharose (cane sugar), a polysaccharide such as dextrin or starch, or a mixture of some of these materials may be used. It is desirable that the amount of carbohydrate in the aqueous solution, which depends on the kind of carbohydrate, be within the range of 0.001 to 300 g/l. It is more desirable that the amount of carbohydrate be within the range of 0.005 to 100 g/l. It is further desirable that the amount of carbohydrate be within the range of 0.01 to 60 g/l. Preferably, in the case of forming a layer of zinc oxide as the metal oxide layer by electrodeposition, the base member on which the metal oxide layer is formed is used as a cathode in the aqueous water solution, while zinc, platinum, carbon or the like is used as an anode. Preferably, the density of current flowing through the load resistor is 10 $mA/dm^2$ to 10 $A/dm^2$.

(Substrate)

The substrate 101 is formed by laminating the intermediate layer 101-2, the metal layer 101-3 and the metal oxide layer 101-4 on the base member 101-1 as desired by the above-described methods. An insulating layer may be formed on the substrate 101 for the purpose of facilitating integration of the device.

(Semiconductor Layer)

As a main material of the silicon semiconductor and the semiconductor layer 102 of the present invention, Si in an amorphous phase or a crystalline phase or a mixture of Si in an amorphous phase and Si in a crystalline phase is used. An alloy of Si and C or Ge may be used in place of Si. The semiconductor layer 102 also contains hydrogen and/or halogen atoms. Preferably, the content of these elements is 0.1 to 40 atomic percent. The semiconductor layer 102 may further contain oxygen and nitrogen. To form the semiconductor layer as a p-type semiconductor layer, a group III element is contained. To form the semiconductor layer as an n-type semiconductor layer, a group V element is contained. Each of the p-type and n-type semiconductor layers has, as its electric characteristics, activation energy of preferably 0.2 eV or less, most preferably 0.1 eV or less, and a resistivity of preferably 100 Ωcm or less, most preferably 1 Ωcm or less. It is preferred that in the case of a stack cell (a photovoltaic device having a plurality of pin junctions) the i-type semiconductor layer in a pin junction closer to the light incidence side have a wider bandgap, and the bandgap be reduced at a remoter pin junction. It is also preferred that in each i layer the bandgap minimum value exist on the p layer side of a center in the film thickness direction. A crystalline semiconductor lower in absorption of light or a semiconductor of a wider bandgap is suitable for a doped layer (p-type layer or n-type layer) on the light incidence side. For example, a stack cell formed by stacking two groups of layers forming pin junctions has, as a combination of i-type silicon semiconductor layers, (an amorphous semiconductor layer and a semiconductor layer containing a crystalline phase) or (a semiconductor layer containing a crystalline phase and a semiconductor layer containing a crystalline phase) in the order from the light incidence side. A stack cell formed by stacking three groups of layers forming pin junctions has, as a combination of i-type silicon semiconductor layers, (an amorphous semiconductor layer, an amorphous semiconductor layer and a semiconductor layer containing a crystalline phase), (an amorphous semiconductor layer, a semiconductor layer containing a crystalline phase and a semiconductor layer containing a crystalline phase), or (a semiconductor layer containing a crystalline phase, a semiconductor layer containing a crystalline phase and a semiconductor layer containing a crystalline phase) in the order from the light incidence side. Preferably, the i-type semiconductor layer has an absorption coefficient ($\alpha$) of 5000 cm$^{-1}$ or greater with respect to light (630 nm), an optical conductivity ($\sigma p$) of $10 \times 10^{-5}$ S/cm or higher under irradiation with pseudo-solar light by a solar simulator (AM 1.5, 100 mW/cm$^2$), a dark conductivity ($\sigma d$) of $10 \times 10^{-6}$ S/cm or lower, and Urbach energy of 55 meV or lower according to a constant photocurrent method (CPM). As the i-type semiconductor layer, one slightly exhibiting the behavior of the p type or n type can be used.

Figure 5:
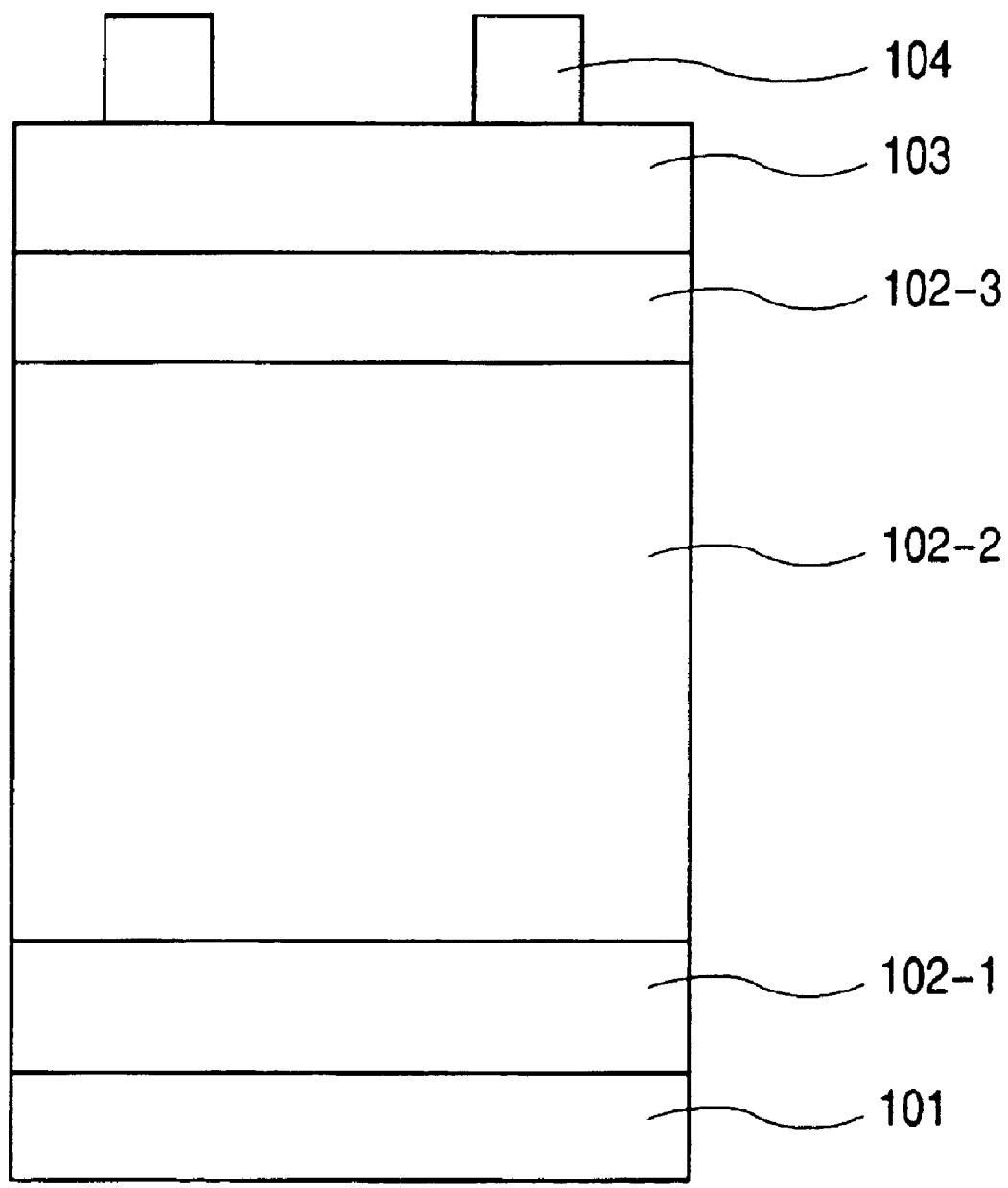
FIG. 5 is a schematic cross-sectional view of another example of the photovoltaic device manufactured in accordance with the present invention.

Further description will be made of the semiconductor layer 102 which is a constituent of the present invention. FIG. 5 is a schematic cross-sectional view of a semiconductor layer 102 having one group of layers forming a pin junction. This semiconductor layer is an example of the semiconductor layer in accordance with the present invention. A layer indicated by 102-1 in FIG. 5 is an amorphous n-type semiconductor layer. An i-type semiconductor layer 102-2 and a p-type semiconductor layer 102-3 containing a crystalline phase are further laminated. Preferably, in semiconductor layers having a plurality of pin junctions, at least one of the groups of layers having pin junctions has the above-described construction.

(Method of Forming Semiconductor Layer)

A radiofrequency plasma CVD method is method is suitable for forming the silicon semiconductor of the present invention and the above-described semiconductor layer 102. An example of a suitable process for forming the semiconductor layer 102 by a radiofrequency plasma CVD method will be described.

(1) The interior of a forming chamber (vacuum chamber) which can be maintained in a depressurized state is depressurized to a predetermined pressure.

(2) A raw-material gas and a material gas such as a diluent gas are introduced into the forming chamber, and the pressure in the forming chamber is set to a predetermined pressure by evacuating the forming chamber with a vacuum pump.

(3) The substrate 101 is set to a predetermined temperature by using a heater.

(4) A radiofrequency wave oscillated by a radiofrequency power source is introduced into the forming chamber. As a method of introducing the radiofrequency wave into the forming chamber, a method of guiding the radiofrequency wave through a waveguide and introducing the radiofrequency wave into the forming chamber through a window made of a dielectric such as an alumina ceramic, or a method of guiding the radiofrequency wave through a coaxial cable and introducing the radiofrequency wave into the forming chamber by using a metal electrode may be used.

(5) The raw-material gas is decomposed by generating a plasma in the forming chamber to form a semiconductor layer on substrate 101 placed in the forming chamber. This process is repeated a certain number of times to form semiconductor layer 102.

The following are examples of suitable conditions for forming the silicon semiconductor of the present invention and the above-described semiconductor layer 102 are as described below. The temperature of the formation surface in the forming chamber is 100 to 450° C., the pressure is 50 mPa to 1500 Pa, and the radiofrequency power is 0.001 to 1W/cm$^3$.

An example of a raw-material material gas suitable for forming the silicon semiconductor of the present invention and the above-described semiconductor layer 102 is a gasifiable compound such as SiH$_4$, Si$_2$H$_6$ or SiF$_4$ containing silicon atoms. In the case of forming an alloy semiconductor, it is desirable to add to a row-material gas a gasifiable compound such as GeH$_4$ or CH$_4$ containing Ge or C. It is desirable that the raw-material gas be diluted with a diluent gas when introduced into the forming chamber. The diluent gas is, for example, H$_2$ or He. Further, a gasifiable compound containing nitrogen or oxide for example may be added as a raw-material gas or a diluent gas. B$_2$H$_6$, BF$_3$ or the like may be used as a dopant gas for forming a p-type semiconductor layer. Also, PH$_3$, PF$_3$ or the like may be used as a dopant gas for forming an n-type semiconductor layer. In the case of forming a thin film in a crystalline phase or a layer such as an SiC layer lower in absorption of or having a wider bandgap, it is preferable to increase the proportion of the diluent gas relative to that of the raw-material gas and to introduce a radiofrequency wave at a comparatively high power.

(Transparent Electroconductive Layer)

The transparent electroconductive layer 103 is an electrode on the light incidence side and can also have a role of antireflection film if its thickness is set to a suitable value. It is necessary for the transparent electroconductive layer 103 to have a high transmittance in the absorbable wavelength region of the semiconductor layer 102 and to have a low resistivity. The transmittance at 550 nm is preferably 80% or higher, more preferably 85% or higher. As a material for the transparent electroconductive layer 103, ITO, ZnO, $In_2O_3$ or the like is favorably used. As a method for forming the transparent electroconductive layer 103, evaporation, CVD, spraying, spin-on, immersion or the like is favorably used. A material for changing the conductivity may be added to each of the above-described materials.

(Current Collecting Electrode)

The current collecting electrode 104 is provided on the transparent electrode 103 to improved the current collection efficiency. As a method of forming the current collecting electrode 104, a method of forming a metal in an electrode pattern by sputtering using a mask, a method of printing an electroconductive conductive paste or a soldering paste or a method of fixing a metal wire by an electroconductive paste is favorably used.

A protective layer may be formed on two surfaces of the photovoltaic device if necessary. A reinforcing member such as a steel plate may also be provided, for example, on the back surface (opposite from the light incidence side) of the photovoltaic device.

EXAMPLES

Solar cells will be described as examples of the photovoltaic device of the present invention. However, the present invention is not limited by the examples described below.

Example 1

A band-like base member 304 made of stainless steel (SUS430BA) (40 cm wide, 200 m long and 0.125 mm thick) was sufficiently degreased and cleansed. Thereafter, a substrate formed of an intermediate layer 101-2, a metal layer (A) 101-3A, a metal layer (B) 101-3B, a metal layer (C) 101-3C, a metal oxide layer (A) 101-4A and a metal oxide layer (B) 101-4B was formed by using a metal layer/metal oxide layer forming apparatus 301 shown in FIG. 3.

Figure 3:
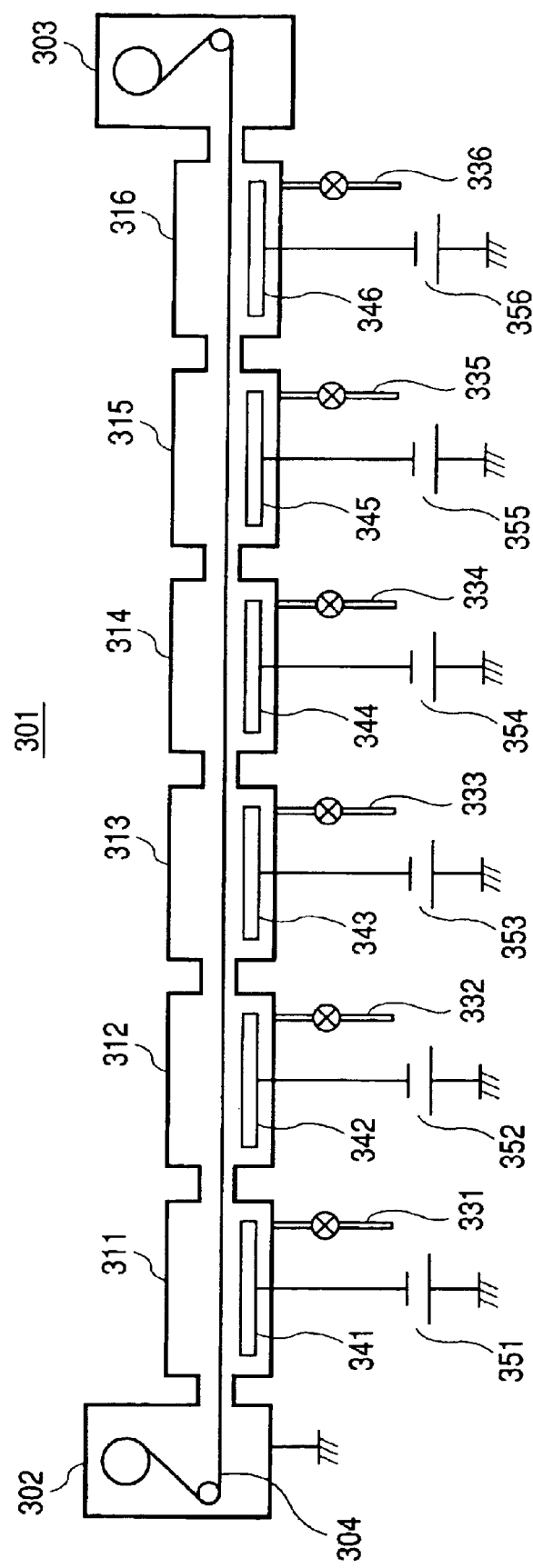
FIG. 3 is a schematic cross-sectional view of an example of a metal layer/metal oxide layer forming apparatus used in the present invention.

FIG. 3 is a schematic cross-sectional view of an example of the metal layer/metal oxide layer forming apparatus 301 for manufacturing the substrate of the photovoltaic device of the present invention. The metal layer/metal oxide layer forming apparatus 301 shown in FIG. 3 is constructed by connecting a substrate feed-out container 302, an intermediate layer forming vacuum container 311, a metal layer (A) forming vacuum container 312, a metal layer (B) forming vacuum container 313, a metal layer (C) forming vacuum container 314, a metal oxide layer (A) forming vacuum container 315, a metal oxide layer (B) forming vacuum container 316 and a substrate take-up container 303 through gas gates. In this semiconductor layer forming apparatus 301, the band-like base member 304 is set so as to extend through each forming vacuum container. The band-like base member 304 is unwound from a bobbin placed in the substrate feed-out container 302 and is wound around another bobbin in the substrate take-up container 303.

Targets are provided as cathodes 341 to 346 in the forming vacuum containers. Sputtering from the targets can be performed by using DC power supplies 351 to 356 to form intermediate layer 101-2, metal layer (A) 101-3A, metal layer (B) 101-3B, metal layer (C) 101-3C, metal oxide layer (A) 101-4A and metal oxide layer (B) 101-4B on the base member. Gas introducing pipes 331 to 336 for introducing sputtering gases are respectively connected to the forming vacuum containers.

While the metal layer/metal oxide layer forming apparatus 301 shown in FIG. 3 has six forming vacuum containers, it is not necessary to perform film forming in all the forming vacuum containers in the examples described below and it is possible to select execution/non-execution of forming in each forming vacuum container according to the layer construction of the substrate to be manufactured. In each forming container, a film forming region adjusting plate (not shown) for adjusting the area of contact between the base member 304 and the discharge space is provided. It is possible to adjust the thickness of the semiconductor layer formed in each forming container by adjusting the film forming region adjusting plate.

The base member 304 was placed in the metal layer/metal oxide layer forming apparatus 301 and each forming container was evacuated until the pressure therein became equal to 1.0 mPa or lower.

Thereafter, sputtering gases were supplied through the gas introducing pipes 331 to 336 while the evacuation system was being operated. Simultaneously, Ar gas was supplied as a gate gas at 50 $cm^3$/min (normal) to each gas gate through a gate gas supply pipe (not shown). In this sate, the pressure in each forming vacuum container was adjusted to a predetermined pressure by adjusting the evacuation ability of the evacuation system. Forming conditions were as shown in Table 1.

When the pressure in each forming vacuum container was stabilized, the movement of the base member 304 in the direction from the substrate feed-out container 302 toward the substrate take-up container 303 was started. While the base member 304 was being moved, an infrared lamp heater in each forming vacuum container was energized to adjust the temperature of the formation surface of the base member 304 to the value shown in Table 1. A titanium target having a purity of 99.99 wt % was used as cathode electrode 341. A silver target having a purity of 99.99 wt % was used as each of cathode electrodes 342 to 344. A zinc oxide target having a purity of 99.99 wt % was used as each of cathode electrodes 345 and 346. Sputtering power shown in Table 1 was applied to each cathode electrode. Intermediate layer 101-2 formed of titanium (50 nm thick, at a forming rate of 1.5 nm/s), metal layer (A) 101-3A formed of silver (50 nm thick, at a forming rate of 1.5 nm/s), metal layer (B) 101-3B formed of silver (750 nm thick, at a forming rate of 8.0 nm/s), metal layer (C) 101-3C formed of silver (50 nm thick, at a forming rate of 1.5 nm/s), metal oxide layer (A) 101-4A formed of zinc oxide (10 nm thick, at a forming rate of 1.0 nm/s) and metal oxide layer (B) 101-4B formed of zinc oxide (2000 nm thick, at a forming rate of 10.0 nm/s) were formed, thus forming the band-like substrate (Example 1-1).

Next, the pin-type photovoltaic device shown in FIG. 5 was formed by a process described below, using a semiconductor layer forming apparatus 201 shown in FIG. 4. FIG. 5 is a schematic cross-sectional view of an example of a photovoltaic device having the silicon semiconductor of the present invention. In FIG. 5, the same components as those shown in FIG. 1 are indicated by the same reference characters. Description for the same components will not be repeated. The semiconductor layer of this photovoltaic device is formed of an amorphous n-type semiconductor layer 102-1, an i-type semiconductor layer 102-2 containing a crystalline phase, and a p-type semiconductor layer 102-3 containing a crystalline phase. That is, this photovoltaic device is a pin-type single-cell photovoltaic device.

Figure 4:
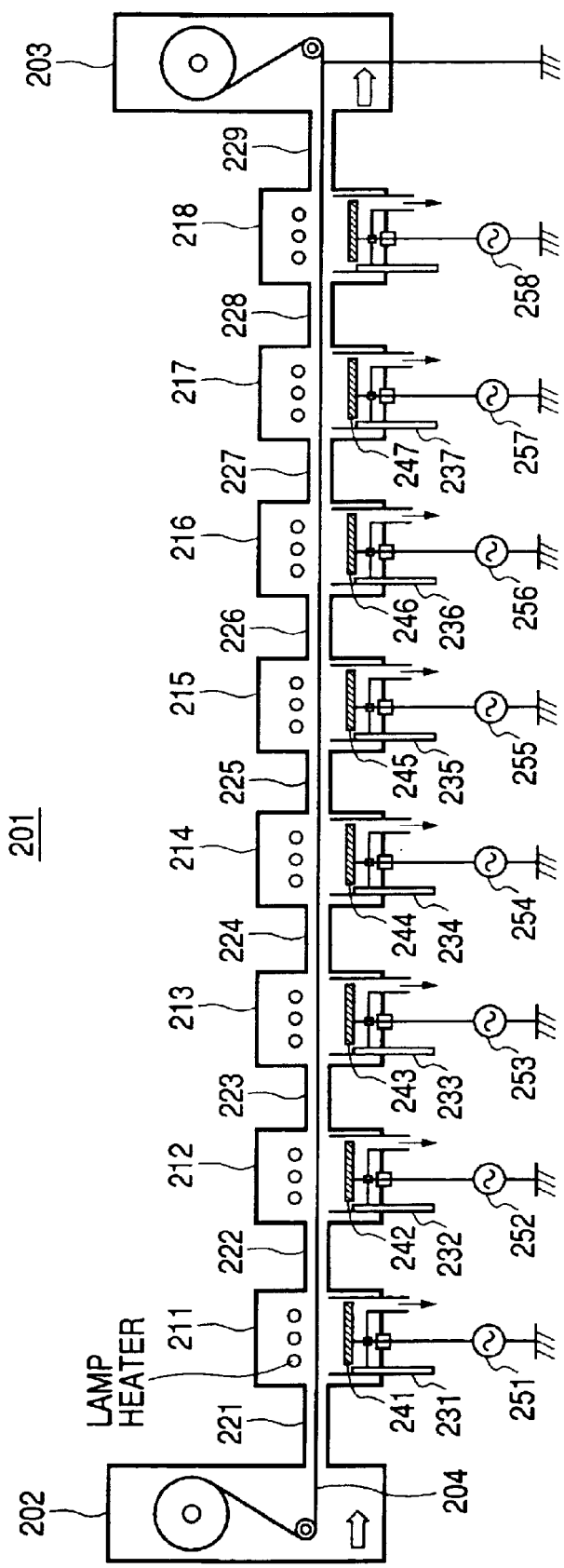
FIG. 4 is a schematic cross-sectional view of an example of a semiconductor layer forming apparatus used in the present invention.

FIG. 4 is a schematic cross-sectional view of an example of a semiconductor layer forming apparatus 201 for manufacturing the silicon semiconductor and the photovoltaic device of the present invention. The semiconductor layer forming apparatus 201 shown in FIG. 4 is constructed by connecting a substrate feed-out container 202, semiconductor forming vacuum containers 211 to 218 and a substrate take-up container 203 through gas gates. In this semiconductor layer forming apparatus 201, a band-like substrate 204 is set so as to extend through each container and each gas gate. The band-like substrate 204 is unwound from a bobbin placed in the substrate feed-out container 202 and is wound around another bobbin in the substrate take-up container 203.

The semiconductor forming vacuum containers 211 to 218 respectively have forming chambers in which glow discharge is caused by application of radiofrequency power from radiofrequency power supplies 251 to 258 to discharging electrodes 241 to 248. Raw-material gases are thereby decomposed to form semiconductor layers on the substrate 204. Gas introducing pipes 231 to 238 for introducing raw-material gases and diluent gases are respectively connected to the semiconductor forming vacuum containers 211 to 218.

While the semiconductor layer forming apparatus 201 shown in FIG. 4 has eight semiconductor forming vacuum devices, it is not necessary to cause glow discharge in all the semiconductor forming vacuum containers in the examples described below and it is possible to select execution/non-execution of glow discharge in each container according to the layer construction of the photovoltaic device to be manufactured. In each semiconductor forming device, a film forming region adjusting plate (not shown) for adjusting the area of contact between the substrate 204 and the discharge space in each forming chamber is provided. It is possible to adjust the thickness of the semiconductor layer formed in each container by adjusting the film forming region adjusting plate.

The bobbin around which the substrate 204 was wound was set in the substrate feed-out container 202 and was led to the substrate take-up container 203 via the entrance-side gas gate, the substrate layer forming vacuum containers 211 to 218 and the exit-side gas gate, and tension adjustment was performed so that the band-like substrate 204 did not sag. The substrate feed-out container 202, the semiconductor layer forming vacuum containers 211 to 218 and the substrate take-up containers 203 were evacuated to 1.0 mPa or lower by an evacuation system formed by a vacuum pump (not shown).

Subsequently, raw-material gases and diluent gases were supplied to the semiconductor layer forming vacuum containers 211 to 215 through the gas introducing pipes 231 to 235 while the evacuation system was being operated.

Also, H$_2$ gas was supplied at 200 cm$^3$/min (normal) to the semiconductor layer forming vacuum containers other than the semiconductor layer forming vacuum containers 211 to 215 through the gas introducing pipes. Simultaneously, H$_2$ gas was supplied as a gate gas at 500 cm$^3$/min (normal) to each gas gate through a gate gas supply pipe (not shown). In this state, the pressure in each of the semiconductor layer forming vacuum containers 211 to 215 was adjusted to a desired pressure by adjusting the evacuation ability of the evacuation system. Forming conditions were as shown in Table 2.

When the pressure in each of the semiconductor layer forming vacuum containers 211 to 215 was stabilized, the movement of the substrate 204 in the direction from the substrate feed-out container 202 toward the substrate take-up container 203 was started.

Next, radiofrequency waves were introduced from the radiofrequency power supplies 251 to 255 to the discharging electrodes 241 to 245 in the semiconductor layer forming vacuum containers 211 to 215 to cause glow discharge in the forming chambers in the semiconductor layer forming vacuum containers 211 to 215, thereby forming an amorphous n-type semiconductor layer (50 nm thick), an i-type semiconductor layer (1.5 µm thick) containing a crystalline phase and a p-type semiconductor layer (10 nm thick) containing a crystalline phase on the substrate 204. The photovoltaic device was thus formed (Example 1-2).

In this process, radiofrequency power at a frequency of 13.56 MHz and a power density of 5 mW/cm$^3$ was introduced into the semiconductor forming vacuum container 211, radiofrequency power at a frequency of 60 MHz and a power density of 300 mW/cm$^3$ into the semiconductor forming vacuum containers 212 to 214, and radiofrequency power at a frequency of 13.56 MHz and a power density of 30 mW/cm$^3$ into the semiconductor forming vacuum container 215. The band-like photovoltaic device thus formed was worked into 36×22 cm solar cell modules (Example 1-3) by continuous modulation apparatus (not shown).

Example 2

Substrates, photovoltaic devices and solar cell modules (Example 2-1, Example 2-2, Example 2-3) were made by the same process as that in Example 1 except that oxygen was not introduced at the time of forming of metal layer (C) 101-3C and metal oxide layer (A) 101-4A.

Example 3

Substrates, photovoltaic devices and solar cell modules (Example 3-1, Example 3-2, Example 3-3) were made by the same process as that in Example 1 except that metal layer (A) 101-3A was not formed.

Example 4

Substrates, photovoltaic devices and solar cell modules (Example 4-1, Example 4-2, Example 4-3) were made by the same process as that in Example 1 except that metal layer (C) 101-3C was not formed.

Example 5

Substrates, photovoltaic devices and solar cell modules (Example 5-1, Example 5-2, Example 5-3) were made by the same process as that in Example 1 except that metal oxide layer (A) 101-4A was not formed.

Comparative Example 1

Substrates, photovoltaic devices and solar cell modules (Comparative Example 1-1, Comparative Example 1-2, Comparative Example 1-3) were made by the same process as that in Example 1 except that intermediate layer 101-2 was not formed.

Comparative Example 2

Substrates, photovoltaic devices and solar cell modules (Comparative Example 2-1, Comparative Example 2-2, Comparative Example 2-3) were made by the same process as that in Example 1 except that the rate of formation of metal layer (A) 101-3A and metal layer (C) 101-3C was the same as the rate of formation of metal layer (B) 101-3B, and that the rate of formation of metal oxide layer (A) 101-4A was the same as the rate of formation of metal oxide layer (B) 101-4B.

The reflectances of the substrates made in the examples of the present invention and the comparative examples were measured with respect to light of 800 nm, and the adhesion between the base member, the metal layer and the metal oxide layer was examined by using a grid tape method (the intervals between cuts: 1 mm; the number of squares: 100). Further, sub-cells were formed by making 100 transparent electrodes having a size of 1 cm$^2$ and current collectors on the photovoltaic devices in the examples of the present invention and the comparative examples, and the photoelectric conversion efficiency of each sub-cell was measured by using the solar simulator (AM 1.5, 100 mW/cm$^2$), thereby examining the average and uniformity of the photoelectric conversion efficiency. Further, the photoelectric conversion efficiency of each of the solar cell modules made in the examples of the present invention and the comparative examples was measured, the solar cell module was thereafter placed in a dark place at a temperature of 85° C. and a humidity of 85% and maintained for 500 hours while a reverse bias of 10V was being applied. Thereafter, the photoelectric conversion efficiency was again measured to examine a change in photoelectric conversion efficiency due to application of the reverse bias under high-temperature and high-humidity conditions. Table 3 shows the results of these examinations.

It can be understood that the substrates, the photovoltaic devices and the solar cell modules in Examples 1 to 5 of the present invention were superior to those in the comparative examples, as shown in Table 3. SEM observation of the states of portions peeled by the grid tape method in Comparative Example 1 was also performed, thereby confirming that separation was caused between the stainless base member and the silver metal layer. From the above, it can be understood that the substrates and the photovoltaic devices using the laminates in accordance with the present invention and the solar cell modules including the substrates and the photovoltaic devices have improved qualities. In particular, the substrate, the photovoltaic device and the solar cell module in Example 1 are excellent in each evaluation item.

Example 6

Substrates and solar cell modules (Examples 6-1 to 6-5) were made in the same manner as in Example 1 except that the thickness of intermediate layer 101-2 was changed to 10 nm, 30 nm, 80 nm, 100 nm, and 150 nm. The reflectance of the substrates thereby made was measured with respect to light of 800 nm, the adhesion in the substrates was examined by the grid tape method, and the photoelectric conversion efficiency of the solar cell modules was measured by using the solar simulator (AM 1.5, 100 mW/cm$^2$). The results of the measurement and examination in Example 6 were shown in Table 4 together with the results with respect to Comparative Example 1 made without the intermediate layer.

It can be understood that the substrates and the photovoltaic devices using the laminates in accordance with the present invention and the solar cell modules including the substrates and the photovoltaic devices have improved qualities, as shown in Table 4. In particular, the substrates, the photovoltaic devices and the solar cell modules having the thickness of the intermediate layer within the range of 30 nm to 100 nm are excellent in reflectance, adhesion and photoelectric conversion efficiency.

Example 7

Substrates and solar cell modules (Examples 7-1 to 7-6) were made in the same manner as in Example 1 except that the rate of formation of metal layer (A) 101-3A was changed to 0.3 nm/s, 0.5 nm/s, 1.0 nm/s, 2.0 nm/s, 4.0 nm/s, and 5.0 nm/s. The reflectance of the substrates thereby made was measured with respect to light of 800 nm, and the photoelectric conversion efficiency of the solar cell modules was measured by using the solar simulator (AM 1.5, 100 mW/cm$^2$). Further, each solar cell module was placed in a dark place at a temperature of 85° C. and a humidity of 85% and maintained for 500 hours while a reverse bias of 10V was being applied. Thereafter, the photoelectric conversion efficiency was again measured to examine a change in photoelectric conversion efficiency due to application of the reverse bias under high-temperature and high-humidity conditions. Table 5 shows the results of these measurements.

It can be understood that the substrates and the photovoltaic devices using the laminates in accordance with the present invention and the solar cell modules including the substrates and the photovoltaic devices have improved qualities, as shown in Table 5. It can also be understood that the substrates, the photovoltaic devices and the solar cell modules formed by setting the rate of formation of metal layer (A) to a value not higher than 4.0 nm/s have particularly improved qualities in terms of reflectance, photoelectric conversion efficiency and the results of the high-temperature and high-humidity reverse bias application test. Also, those formed by setting the rate of formation of metal layer (A) to 0.5 nm/s or higher are particularly advantageous in terms of productivity since metal layer (A) can be formed in a shorter time in comparison with metal layer (B).

Example 8

Substrates and solar cell modules (Examples 8-1 to 8-6) were made in the same manner as in Example 1 except that the rate of formation of metal layer (C) 101-3C was changed to 0.3 nm/s, 0.5 nm/s, 1.0 nm/s, 2.0 nm/s, 4.0 nm/s, and 5.0 nm/s. The reflectance of the substrates thereby made was measured with respect to light of 800 nm, and the photoelectric conversion efficiency of the solar cell modules was measured by using the solar simulator (AM 1.5, 100 mW/cm$^2$). Further, each solar cell module was placed in a dark place at a temperature of 85° C. and a humidity of 85% and maintained for 500 hours while a reverse bias of 10V was being applied. Thereafter, the photoelectric conversion efficiency was again measured to examine a change in photoelectric conversion efficiency due to application of the reverse bias under high-temperature and high-humidity conditions. Table 6 shows the results of these measurements.

It can be understood that the substrates and the photovoltaic devices using the laminates in accordance with the present invention and the solar cell modules including the substrates and the photovoltaic devices have improved qualities, as shown in Table 6. It can also be understood that the substrates, the photovoltaic devices and the solar cell modules formed by setting the rate of formation of metal layer (C) 101-3C to a value not higher than 4.0 nm/s have particularly improved qualities in terms of reflectance, photoelectric conversion efficiency and the results of the high-temperature and high-humidity reverse bias application test. Also, those formed by setting the rate of formation of metal layer (C) 101-3C to 0.5 nm/s or higher are particularly advantageous in terms of productivity since metal layer (C) 101-3C can be formed in a shorter time in comparison with metal layer (B) 101-3B.

Example 9

Substrates and solar cell modules (Examples 9-1 to 9-4) were made in the same manner as in Example 1 except that the rate of formation of metal oxide layer (A) 101-4A was changed to 0.03 nm/s, 0.05 nm/s, 3.0 nm/s, and 5.0 nm/s. The reflectance of the substrates thereby made was measured with respect to light of 800 nm, and the photoelectric conversion efficiency of the solar cell modules was measured by using the solar simulator (AM 1.5, 100 mW/cm$^2$). Further, each solar cell module was placed in a dark place at a temperature of 85° C. and a humidity of 85% and maintained for 500 hours while a reverse bias of 10V was being applied. Thereafter, the photoelectric conversion efficiency was again measured to examine a change in photoelectric conversion efficiency due to application of the reverse bias under high-temperature and high-humidity conditions. Table 7 shows the results of these measurements.

It can be understood that the substrates and the photovoltaic devices using the laminates in accordance with the present invention and the solar cell modules including the substrates and the photovoltaic devices have improved qualities, as shown in Table 7. It can also be understood that the substrates, the photovoltaic devices and the solar cell modules formed by setting the rate of formation of metal oxide layer (A) 101-4A to a value not higher than 3.0 nm/s have particularly improved qualities in terms of reflectance, photoelectric conversion efficiency and the results of the high-temperature and high-humidity reverse bias application test. Also, those formed by setting the rate of formation of metal oxide layer (A) 101-4A to 0.05 nm/s or higher are particularly advantageous in terms of productivity since metal oxide layer (A) 101-4A can be formed in a shorter time in comparison with metal oxide layer (B) 101-4B.

Example 10

Figure 6:
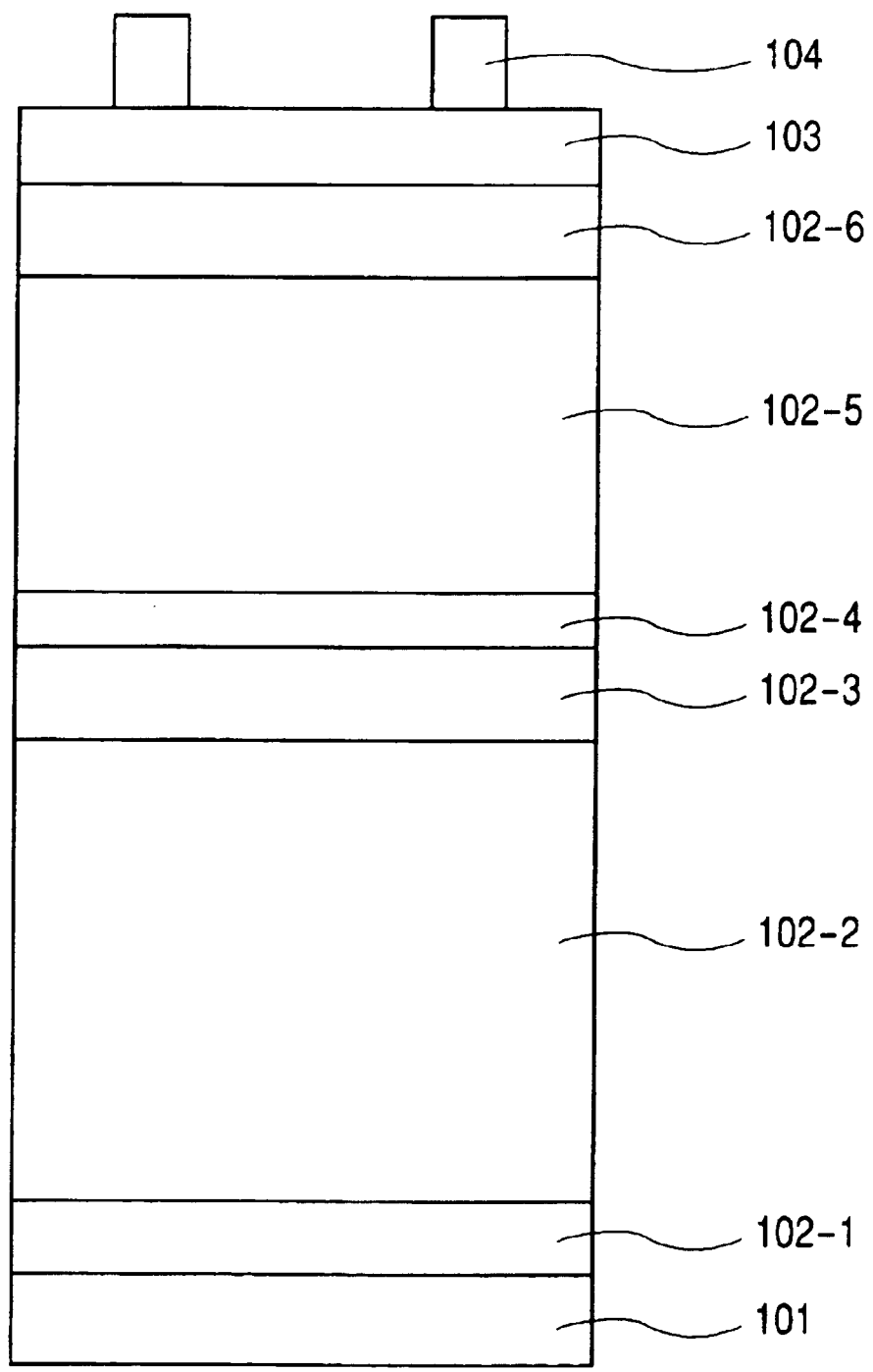
FIG. 6 is a schematic cross-sectional view of another example of the photovoltaic device manufactured in accordance with the present invention.

A photovoltaic device shown in FIG. 6 was formed by a process described below, using the semiconductor layer forming apparatus 201 shown in FIG. 4. FIG. 6 is a schematic cross-sectional view of an example of a photovoltaic device having the silicon thin film in accordance with the present invention. In FIG. 6, the same components as those shown in FIG. 1 are indicated by the same reference characters. Description for the same components will not be repeated. The semiconductor layer of this photovoltaic device is formed of amorphous n-type semiconductor layers 102-1 and 102-4, an i-type semiconductor layer 102-2 containing a crystalline phase, an amorphous i-type semiconductor layer 102-5, and p-type semiconductor layers 102-3 and 102-6 each containing a crystalline phase. That is, this photovoltaic device is a pin-pin-type double-cell photovoltaic device.

A substrate 204 was made in the same manner as in Example 1 and mounted in the semiconductor layer forming apparatus 201, and the substrate feed-out container 202, the semiconductor layer forming vacuum containers 211 to 218 and the substrate take-up containers 203 were evacuated to 1.0 mPa or lower by an evacuation system formed by a vacuum pump (not shown).

Subsequently, raw-material gases and diluent gases were supplied to the semiconductor layer forming vacuum containers 211 to 218 through the gas introducing pipes 231 to 238 while the evacuation system was being operated. Also, H$_2$ gas was supplied at 500 cm$^3$/min (normal) to each gas gate through a gate gas supply pipe (not shown). In this state, the pressure in each of the semiconductor layer forming vacuum containers 211 to 218 was adjusted to a desired pressure by adjusting the evacuation ability of the evacuation system. Forming was performed under the same conditions as in the case of the method in Example 1 with respect to the semiconductor forming vacuum containers 211 to 215, and the conditions with respect to the semiconductor forming vacuum containers 216 to 218 were as shown in Table 8.

When the pressure in each of the semiconductor layer forming vacuum containers 211 to 218 was stabilized, the movement of the electroconductive substrate 204 in the direction from the substrate feed-out container 202 toward the substrate take-up container 203 was started.

Next, radiofrequency waves were introduced from radiofrequency power supplies 251 to 258 to radio frequency wave introducing portions 241 to 248 in the semiconductor forming vacuum containers 211 to 218 to cause glow discharge in forming chambers in the semiconductor layer forming vacuum containers 211 to 218, thereby forming on the electroconductive substrate 204 an amorphous n-type semiconductor layer (50 nm thick), an i-type semiconductor layer (1.5 μm thick) containing a crystalline phase, a p-type semiconductor layer (10 nm thick) containing a crystalline phase, an amorphous n-type semiconductor layer (30 nm thick), an amorphous i-type semiconductor layer (300 nm thick) and a p-type semiconductor layer (10 nm thick) containing a crystalline phase. The photovoltaic device was thus formed.

In this process, radiofrequency power at a frequency of 13.56 MHz and a power density of 5 mW/cm$^3$ was introduced into the semiconductor forming vacuum containers 211 and 216, radiofrequency power at a frequency of 60 MHz and a power density of 300 mW/cm$^3$ into the semiconductor forming vacuum containers 212 to 214, radiofrequency power at a frequency of 13.56 MHz and a power density of 30 mW/cm$^3$ into the semiconductor forming vacuum containers 215 and 218, and radiofrequency power at a frequency of 60 MHz and a power density of 50 mW/cm$^3$ into the semiconductor forming vacuum container 217. The band-like photovoltaic device thus formed was worked into 36×22 cm solar cell modules by using continuous modulation apparatus (not shown) (Example 10).

The photoelectric conversion efficiency of the solar cell module thus made was measured by using the solar simulator (AM 1.5, 100 mW/cm$^2$). The measured value of the photoelectric conversion efficiency was 1.15 times higher than that of the single solar cell module in Example 1. Favorable results are also obtained with respect to the peeling test and the temperature and humidity test. From the above, it can be understood that the substrate and the photovoltaic device using the laminate in accordance with the present invention and the solar cell module including the substrate and the photovoltaic device have improved qualities.

Example 11

Figure 7:
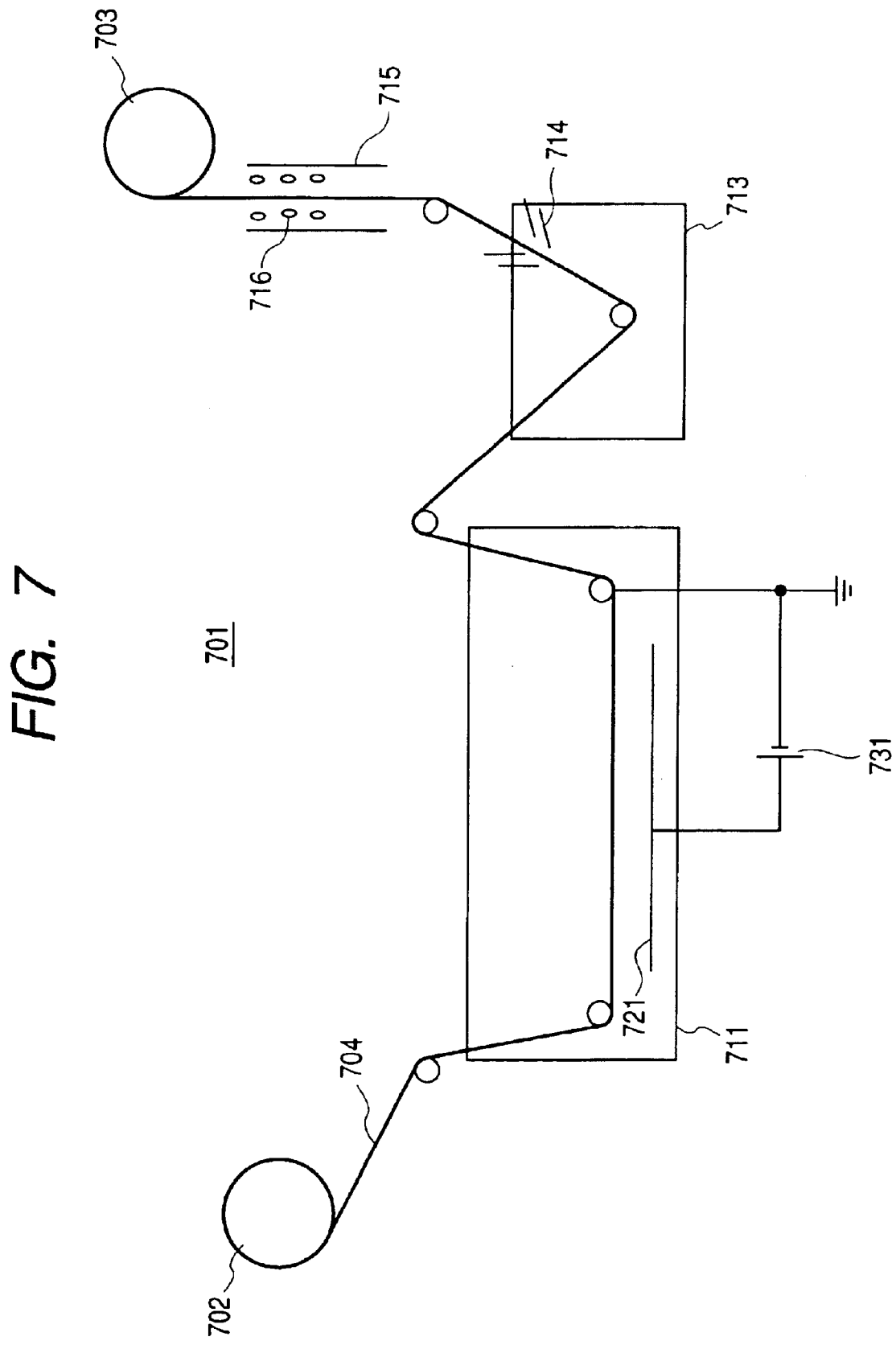
FIG. 7 is a schematic cross-sectional view of an example of a metal oxide layer forming apparatus used in the present invention.

Intermediate layer 101-2, metal layer (A) 101-3A, metal layer (B) 101-3B, metal layer (C) 101-3C, and metal oxide layer (A) 101-4A were formed in the same manner as in Example 1 by using the metal layer/metal oxide layer forming apparatus shown in FIG. 3, and metal oxide layer (B) 101-4B was thereafter formed by using a metal oxide layer forming apparatus shown in FIG. 7, thereby making a substrate.

FIG. 7 is a schematic cross-sectional view of an example of a metal oxide layer forming apparatus 701 for manufacturing the substrate of the photovoltaic device of the present invention. The metal oxide layer forming apparatus 701 shown in FIG. 7 is constituted by a feed-out roller 702, a metal oxide layer forming container 711, a water cleansing container 713, a drying container 715, and a take-up roller 703. A band-like base member 704 is set in this metal oxide layer forming apparatus 701 so as to extend through each container. The band-like base member 704 is unwound from a bobbin placed at the feed-out roller 702 and is wound around another bobbin by the take-up roller 703. A counter electrode 721 made of zinc is provided in the metal oxide layer forming container 711, and is connected to a load resistor (not shown) and a power supply 731.

The temperature of an aqueous solution in the metal oxide layer forming container 711 can be monitored and adjusted by using a heater and a thermocouple (both not shown). In the water cleansing container 713, the aqueous solution on the substrate surface is washed away by using an ultrasonic device (not shown), pure water cleansing is performed by using a pure water shower 714 at the exit side of the water cleansing container. In the drying container 715, the substrate surface can be dried by using an infrared heater 716.

When the aqueous solution in the metal oxide layer forming container 711 had a zinc ion concentration of 0.2 mol/l, pH=5.0, an aqueous solution temperature of 80° C., and a dextrin concentration of 0.05 g/l, conveyance of the base member was started and forming of metal oxide layer (B) made of a zinc oxide was performed. At this time, the density of current flowing through the counter electrode 721 was 200 mA/dm$^2$ and the zinc oxide forming rate was 10 nm/s.

A pin-pin-type double-cell solar module (Example 11) similar to Example 10 was made by using the band-like substrate formed as described above.

The solar cell module made in Example 11 was excellent in adhesion, initial conversion efficiency, and durability with respect to the temperature and humidity test and the high-temperature high-humidity reverse bias application test. From the above, it can be understood that the substrate and the photovoltaic device using the laminate of the present invention and the solar cell module including the substrate and the photovoltaic device have improved qualities.

TABLE 1

| 311 forming conditions | Raw-material gas | Ar: 50 cm$^3$/min (normal) |
| --- | --- | --- |
| | Temperature of formation surface | 400° C. |
| | Pressure | 0.3 Pa |
| | Sputtering power | 0.5 KW |
| 312 forming conditions | Raw-material gas | Ar: 50 cm$^3$/min (normal) |
| | Temperature of formation surface | 400° C. |
| | Pressure | 0.3 Pa |
| | Sputtering power | 0.4 KW |
| 313 forming conditions | Raw-material gas | Ar: 50 cm$^3$/min (normal) |
| | Temperature of formation surface | 400° C. |

TABLE 1-continued

| | Pressure | 0.3 Pa |
| --- | --- | --- |
| | Sputtering power | 3.0 KW |
| 314 forming conditions | Raw-material gas | Ar: 50 cm$^3$/min (normal) |
| | | O$_2$: 10 cm$^3$/min (normal) |
| | Temperature of formation surface | 350° C. |
| | Pressure | 0.3 Pa |
| | Sputtering power | 0.4 KW |
| 315 forming conditions | Raw-material gas | Ar: 50 cm$^3$/min (normal) |
| | | O$_2$: 10 cm$^3$/min (normal) |
| | Temperature of formation surface | 350° C. |
| | Pressure | 0.3 Pa |
| | Sputtering power | 1.0 KW |
| 316 forming conditions | Raw-material gas | Ar: 50 cm$^3$/min (normal) |
| | Temperature of formation surface | 350° C. |
| | Pressure | 0.3 Pa |
| | Sputtering power | 7.0 KW |

TABLE 2

| 211 forming conditions | Raw-material gas | SiH$_4$: 20 cm$^3$/min (normal) |
| --- | --- | --- |
| | | H$_2$: 100 cm$^3$/min (normal) |
| | | PH$_3$ (Diluted to 2% with H$_2$): 30 cm$^3$/min (normal) |
| | Temperature of formation surface | 300° C. |
| | Pressure | 100 Pa |
| 212 to 214 forming conditions | Raw-material gas | SiH$_4$: 30 cm$^3$/min (normal) |
| | | SiF$_4$: 100 cm$^3$/min (normal) |
| | | H$_2$: 500 cm$^3$/min (normal) |
| | Temperature of formation surface | 300° C. |
| | Pressure | 100 Pa |
| 215 forming conditions | Raw-material gas | SiH$_4$: 10 cm$^3$/min (normal) |
| | | H$_2$: 800 cm$^3$/min (normal) |
| | | BF$_3$ (Diluted to 2% with H$_2$): 100 cm$^3$/min (normal) |
| | Temperature of formation surface | 200° C. |
| | Pressure | 150 Pa |

TABLE 3

| | | Example 1 | Example 2 | Example 3 | Example 4 | Example 5 | Comparative Example 1 | Comparative Example 2 |
| --- | --- | --- | --- | --- | --- | --- | --- | --- |
| Reflectance | Total reflection | 1 | 0.96 | 0.95 | 1.01 | 0.98 | 0.96 | 0.90 |
| | Diffused reflection | 1 | 0.97 | 0.95 | 0.98 | 1.00 | 0.89 | 0.90 |
| Grid tape method | | 1 | 0.98 | 0.97 | 0.96 | 0.98 | 0.81 | 0.95 |
| Average value of photoelectric conversion efficiency | | 1 | 0.97 | 0.96 | 1.01 | 1.00 | 0.90 | 0.91 |

TABLE 3-continued

|  | Example 1 | Example 2 | Example 3 | Example 4 | Example 5 | Comparative Example 1 | Comparative Example 2 |
|---|---|---|---|---|---|---|---|
| Uniformity of photoelectric conversion efficiency | 1 | 1.02 | 1.05 | 1.04 | 1.06 | 1.20 | 1.08 |
| Change in photoelectric conversion efficiency due to high-temperature high-humidity bias application test | 1.0 | 1.0 | 0.97 | 0.96 | 0.95 | 0.88 | 0.92 |

The reflectivity is standardized with respect to the value in Example 1 shown as 1.

The value in the grid tape method is standardized with respect to the number of squares not peeled in Embodiment 1, shown as 1.

The average of the photoelectric conversion efficiency is standardized with respect the value in Example 1 shown as 1.

The uniformity of the photoelectric conversion efficiency is standardized with respect the value of the standard deviation in Example 1 shown as 1.

The change in photoelectric conversion efficiency due to the high-temperature high-humidity reverse bias test is the value of the efficiency after the test/the initial efficiency.

TABLE 4

|  | Thickness of intermediate layer | Reflectance | | Grid tape method | Photoelectric conversion efficiency |
|---|---|---|---|---|---|
|  |  | Total reflection | Diffused reflection |  |  |
| Comparative Example 1 | 0 nm | 0.92 | 0.89 | 0.81 | 0.90 |
| Example 6-1 | 10 nm | 0.95 | 0.92 | 0.96 | 0.95 |
| Example 6-2 | 30 nm | 1.02 | 0.98 | 1 | 0.98 |
| Example 1 | 50 nm | 1 | 1 | 1 | 1 |
| Example 6-3 | 80 nm | 1.03 | 0.98 | 1 | 1.02 |
| Example 6-4 | 100 nm | 0.98 | 1.02 | 1 | 1.00 |
| Example 6-5 | 150 nm | 0.96 | 0.98 | 1 | 0.96 |

The reflectivity is standardized with respect to the value in Example 1 shown as 1.

The value in grid tape method is standardized with respect to the number of squares not peeled in Embodiment 1, shown as 1.

The photoelectric conversion efficiency is standardized with respect to the value in Example 1 shown as 1.

TABLE 5

|  | Rate of formation of metal layer (A) | Reflectance | | Photoelectric conversion efficiency | Change in photoelectric conversion efficiency due to high-temperature high-humidity bias application test |
|---|---|---|---|---|---|
|  |  | Total reflection | Diffused reflection |  |  |
| Example 7-1 | 0.3 nm/s | 1.0 | 0.98 | 0.98 | 1.0 |
| Example 7-2 | 0.5 nm/s | 1.02 | 1.0 | 1.0 | 1.0 |
| Example 7-3 | 1.0 nm/s | 1.02 | 0.98 | 0.98 | 1.0 |
| Example 1 | 1.5 nm/s | 1 | 1 | 1 | 1.0 |
| Example 7-4 | 2.0 nm/s | 1.0 | 1.0 | 1.0 | 1.0 |
| Example 7-5 | 4.0 nm/s | 1.0 | 0.98 | 1.0 | 1.0 |
| Example 7-6 | 5.0 nm/s | 0.97 | 0.98 | 0.96 | 0.97 |

The reflectivity is standardized with respect to the value in Example 1 shown as 1.

The photoelectric conversion efficiency is standardized with respect to the value in Example 1 shown as 1.

The change in photoelectric conversion efficiency due to the high-temperature high-humidity reverse bias test is the value of the efficiency after the test/the initial efficiency.

TABLE 6

|  | Rate of formation of metal layer (C) | Reflectance | | Photo- electric conversion efficiency | Change in photoelectric conversion efficiency due to high-temperature high-humidity bias application test |
| --- | --- | --- | --- | --- | --- |
|  |  | Total reflec- tion | Diffused reflec- tion |  |  |
| Example 8-1 | 0.3 nm/s | 1.02 | 1.0 | 1.0 | 1.0 |
| Example 8-2 | 0.5 nm/s | 1.0 | 0.98 | 0.98 | 1.0 |
| Example 8-3 | 1.0 nm/s | 1.04 | 0.98 | 0.98 | 1.0 |
| Example 1 | 1.5 nm/s | 1 | 1 | 1 | 1.0 |
| Example 8-4 | 2.0 nm/s | 1.0 | 1.02 | 1.0 | 1.0 |
| Example 8-5 | 4.0 nm/s | 1.0 | 1.0 | 1.0 | 1.0 |
| Example 8-6 | 5.0 nm/s | 0.98 | 0.96 | 0.96 | 0.98 |

The reflectivity is standardized with respect to the value in Example 1 shown as 1.

The photoelectric conversion efficiency is standardized with respect to the value in Example 1 shown as 1.

The change in photoelectric conversion efficiency due to the high-temperature high-humidity reverse bias test is the value of the efficiency after the test/the initial efficiency.

TABLE 7

|  | Rate of formation of metal oxide layer (A) | Reflectance | | Photo- electric conversion efficiency | Change in photoelectric conversion efficiency due to high-temperature high-humidity bias application test |
| --- | --- | --- | --- | --- | --- |
|  |  | Total reflec- tion | Diffused reflec- tion |  |  |
| Example 9-1 | 0.03 nm/s | 0.96 | 1.0 | 0.98 | 1.0 |
| Example 9-2 | 0.05 nm/s | 1.0 | 0.98 | 0.98 | 1.0 |
| Example 9-3 | 0.1 nm/s | 1.02 | 0.98 | 1.0 | 1.0 |
| Example 1 | 1.0 nm/s | 1 | 1 | 1 | 1.0 |
| Example 9-4 | 3.0 nm/s | 1.02 | 1.02 | 1.04 | 1.0 |
| Example 9-6 | 5.0 nm/s | 0.96 | 0.96 | 0.95 | 0.98 |

The reflectivity is standardized with respect to the value in Example 1 shown as 1.

The photoelectric conversion efficiency is standardized with respect to the value in Example 1 shown as 1.

The change in photoelectric conversion efficiency due to the high-temperature high-humidity reverse bias test is the value of the efficiency after the test/the initial efficiency.

TABLE 8

| 216 forming conditions | Raw-material gas | SiH$_4$: 20 cm$^3$/min (normal) H$_2$: 100 cm$^3$/min (normal) PH$_3$ (Diluted to 2% with H$_2$): 50 cm$^3$/min (normal) |
| --- | --- | --- |
|  | Temperature of formation surface | 300° C. |
|  | Pressure | 100 Pa |
| 217 forming | Raw-material gas | SiH$_4$: 300 cm$^3$/min (normal) H$_2$: 4000 cm$^3$/min (normal) |
| conditions | Temperature of formation surface | 300° C. |
|  | Pressure | 800 Pa |
| 218 forming conditions | Raw-material gas | SiH$_4$: 10 cm$^3$/min (normal) H$_2$: 800 cm$^3$/min (normal) BF$_3$ (Diluted to 2% with H$_2$): 100 cm$^3$/min (normal) |
|  | Temperature of formation surface | 200° C. |
|  | Pressure | 160 Pa |

The laminate formed according to a preferred embodiment of the present invention and the photovoltaic device using the laminate as a substrate have improved characteristics and maintain improved reflection characteristics and adhesion under high-temperature and high-humidity conditions and during long-term use.

What is claimed is:

1. A method of forming a laminate, comprising a first step of forming an intermediate layer on a base member, and a second step of forming a metal layer on the intermediate layer, the adhesion of the metal layer to the base member being lower than that of the intermediate layer, the reflectance of the metal layer being higher than that of the intermediate layer, wherein the rate of formation of the metal layer is increased at an intermediate stage in said second step.

2. The method according to claim 1, wherein the intermediate layer is formed to a thickness within the range of 30 nm to 100 nm on the base member.

3. The method according to claim 1, wherein the rate of formation of the metal layer before increasing the formation rate is set within the range of 0.5 nm/s to 4.0 nm/s.

4. The method according to claim 1, wherein the rate of formation of the metal layer is increased at a point in time when the metal layer is formed to a thickness within the range of 1 nm to 100 nm on the intermediate layer.

5. A method of manufacturing a photovoltaic device, comprising a first step of forming an intermediate layer on a base member, a second step of forming a metal layer on the intermediate layer, the adhesion of the metal layer to the base member being lower than that of the intermediate layer, the reflectance of the metal layer being higher than that of the intermediate layer, and a third step of forming a semiconductor layer directly on the metal layer or with a metal oxide layer interposed between the semiconductor layer and the metal layer, wherein the rate of formation of the metal layer is increased at an intermediate stage in said second step.

* * * * *

UNITED STATES PATENT AND TRADEMARK OFFICE
CERTIFICATE OF CORRECTION

PATENT NO.    : 6,951,771 B2
DATED         : October 4, 2005
INVENTOR(S)   : Takaharu Kondo et al.

It is certified that error appears in the above-identified patent and that said Letters Patent is hereby corrected as shown below:

<u>Title page,</u>
Item [56], References Cited, OTHER PUBLICATIONS, delete
"A Particle Agglutination Assay For Rapid Identification Of Heparin Binding To Coagulase-negative Staphylococci," C. Pascu, et al., J. Med. Microbiol., vol. 45, pp. 263-269 (1996)."
Insert -- Sannomiya et al., a-SiC/a-Si/a-SiGe Multi-Bandgap Stacked Solar Cells With Bandgap Profiling, Technical Digest of the International PVSEC-5, Kyoto, JP, 1990, pp. 387-390. --.

<u>Column 9,</u>
Line 66, "is method is" should read -- is --.

<u>Column 11,</u>
Line 9, "improved" should read -- improve --.

<u>Column 12,</u>
Line 18, "sate," should read -- state, --.

<u>Column 16,</u>
Line 65, "to 9-4)" should read -- to 9-5) --.

<u>Column 17,</u>
Line 1, "0.05 nm/s," should read -- 0.05 nm/s, 0.1 nm/s, --.

<u>Column 21,</u>
Lines 25 and 28, "respect" should read -- respect to --.

UNITED STATES PATENT AND TRADEMARK OFFICE
CERTIFICATE OF CORRECTION

PATENT NO. : 6,951,771 B2
DATED : October 4, 2005
INVENTOR(S) : Takaharu Kondo et al.

It is certified that error appears in the above-identified patent and that said Letters Patent is hereby corrected as shown below:

<u>Column 23,</u>
Table 7, "Example 9-6" should read -- Example 9-5 --.

Signed and Sealed this

Second Day of May, 2006

JON W. DUDAS
*Director of the United States Patent and Trademark Office*